(12) United States Patent
Tsai et al.

(10) Patent No.: US 10,170,580 B2
(45) Date of Patent: Jan. 1, 2019

(54) STRUCTURE OF GAN-BASED TRANSISTOR AND METHOD OF FABRICATING THE SAME

(71) Applicant: INDUSTRIAL TECHNOLOGY RESEARCH INSTITUTE, Hsinchu (TW)

(72) Inventors: Kan-Hsueh Tsai, Lukang Township, Changhua County (TW); Heng-Yuan Lee, Zhudong Township, Hsinchu County (TW)

(73) Assignee: INDUSTRIAL TECHNOLOGY RESEARCH INSTITUTE, Chutung, Hsinchu (TW)

( * ) Notice: Subject to any disclaimer, the term of this patent is extended or adjusted under 35 U.S.C. 154(b) by 0 days.

(21) Appl. No.: 15/790,858

(22) Filed: Oct. 23, 2017

(65) Prior Publication Data

US 2018/0342598 A1 Nov. 29, 2018

Related U.S. Application Data

(60) Provisional application No. 62/509,759, filed on May 23, 2017.

(30) Foreign Application Priority Data

Jul. 25, 2017 (TW) .............................. 106124850 A (51) Int. Cl.
*H01L 29/40* (2006.01)
*H01L 29/66* (2006.01)
(Continued)

(52) U.S. Cl.
CPC .... *H01L 29/66462* (2013.01); *H01L 21/0254* (2013.01); *H01L 21/02381* (2013.01);
(Continued)

(58) Field of Classification Search
CPC .......................... H01L 29/2003; H01L 29/402
See application file for complete search history.

(56) References Cited

U.S. PATENT DOCUMENTS

| 5,729,054 A | 3/1998 | Summerfelt et al. |
| 7,230,284 B2 | 6/2007 | Parikh et al. |
| (Continued) | | |

FOREIGN PATENT DOCUMENTS

| EP | 1612866 B1 | 7/2014 |
| TW | 201301400 A | 1/2013 |

OTHER PUBLICATIONS

A. D. Koehler et al., "Atomic Layer Epitaxy AlN for Enhanced AlGaN/GaN HEMT Passivation," in *IEEE Electron Device Letters*, vol. 34, No. 9, Sep. 2013, pp. 1115-1117.
(Continued)

*Primary Examiner* — Thomas L Dickey
(74) *Attorney, Agent, or Firm* — Muncy, Geissler, Olds & Lowe, P.C.

(57) ABSTRACT

A GaN-based transistor device comprises a substrate; a buffer layer disposed on the substrate; a channel layer disposed on the buffer layer; a barrier layer disposed on a part of the channel layer; a passivation layer disposed on the barrier layer; wherein the barrier layer and the passivation layer comprise a first side wall and a second side wall; a barrier metal layer disposed on the passivation layer has a first opening that exposes a part of the passivation layer, and the passivation layer has a second opening located in the first opening; a gate electrode disposed on the exposed part of the barrier layer, a source electrode disposed on the channel layer covers the first side wall and a part of the barrier metal layer, and a drain electrode disposed on the channel layer covers the second side wall and another part of the barrier metal layer.

20 Claims, 7 Drawing Sheets

(51) Int. Cl.
  *H01L 29/20* (2006.01)
  *H01L 21/02* (2006.01)
  *H01L 29/45* (2006.01)
  *H01L 29/778* (2006.01)
  *H01L 29/205* (2006.01)
  *H01L 21/285* (2006.01)

(52) U.S. Cl.
  CPC .. *H01L 21/02458* (2013.01); *H01L 21/28575* (2013.01); *H01L 29/2003* (2013.01); *H01L 29/205* (2013.01); *H01L 29/452* (2013.01); *H01L 29/7787* (2013.01)

(56) References Cited

U.S. PATENT DOCUMENTS

| | | | |
|---|---|---|---|
| 8,653,559 B2 | 2/2014 | Corrion et al. | |
| 9,202,880 B1* | 12/2015 | Corrion | H01L 29/402 |
| 9,214,461 B2 | 12/2015 | Cao et al. | |
| 9,425,301 B2 | 8/2016 | Chiu et al. | |
| 9,443,737 B2 | 9/2016 | Kondo et al. | |
| 9,490,356 B2 | 11/2016 | Koehler et al. | |
| 9,536,967 B2 | 1/2017 | Kikkawa et al. | |
| 9,590,069 B2 | 3/2017 | Dasgupta et al. | |
| 9,601,608 B2 | 3/2017 | Tsai et al. | |
| 2012/0228699 A1 | 9/2012 | Lu et al. | |
| 2014/0151712 A1 | 6/2014 | Cao et al. | |
| 2014/0252368 A1 | 9/2014 | Lee et al. | |
| 2014/0264454 A1* | 9/2014 | Banerjee | H01L 29/7786 257/194 |
| 2015/0028384 A1 | 1/2015 | Cao et al. | |
| 2015/0318387 A1* | 11/2015 | Chiu | H01L 23/291 257/76 |
| 2016/0141404 A1 | 5/2016 | Tsai et al. | |

OTHER PUBLICATIONS

M. Higashiwaki, T. Matsui and T. Mimura, "AlGaN/GaN MIS-HFETs with $f_T$ of 163 GHz using cat-CVD SiN gate-insulating and passivation Layers," in *IEEE Electron Device Letters*, vol. 27, No. 1, Jan. 2006, pp. 16-18.

Wen-Kai Wang et al., "Low-κ BCB passivation on AlGaN—GaN HEMT fabrication," in *IEEE Electron Device Letters*, vol. 25, No. 12, Dec. 2004, pp. 763-765.

S. Ozaki et al., "Millimeter-Wave GaN HEMTs With Cavity-Gate Structure Using MSQ-Based Inter-Layer Dielectric," in *IEEE Transactions on Semiconductor Manufacturing*, vol. 29, No. 4, Nov. 2016, pp. 370-375.

Zenji Yatabel, et al; "Insulated gate and surface passivation structures for GaN-based power transistors"; J. Phys. D: Appl. Phys. 49, 2016, pp. 1-20.

An-Jye Tzou et al.; "Non-thermal alloyed ohmic contact process of GaN-based HEMTs by pulsed laser annealing"; Semicond. Sci. Technol. 31; 2016;pp. 1-9.

Masaaki Kuzuhara et al; "AlGaN/GaN high-electron-mobility transistor technology for high-voltage and low-on-resistance operation"; Japanese Journal of Applied Physics 55, 2016; pp. 070101-1-070101-12.

Subramaniam Arulkumaran et al; "Studies on the Influences of i-GaN, n-GaN, p-GaN and InGaN Cap Layers in AlGaN/GaN High-Electron-Mobility Transistors"; Japanese Journal of Applied Physics; vol. 44, No. 5A, 2005, pp. 2953-2960.

* cited by examiner

FIG. 13B

STRUCTURE OF GAN-BASED TRANSISTOR AND METHOD OF FABRICATING THE SAME

CROSS-REFERENCE TO RELATED APPLICATION

This application claims the benefit of a prior-filed U.S. provisional application Ser. No. 62/509,759, filed May 23, 2017, and the benefit of Taiwan application Serial No. 106124850, filed Jul. 25, 2017, the subject matters of which are incorporated herein by references.

BACKGROUND

Technical Field

The disclosure relates to a GaN-based transistor device transistor and a method manufacturing the same.

Related Art

As the technology advances, demands for high power semiconductor devices are also increasing. The conventional Si-based and GaAs semiconductor devices with lower energy gap can hardly satisfy the demands of high power semiconductor devices. As a result, semiconductor made of larger energy gap materials such as SiC or GaN emerges. Comparing semiconductor devices made of materials of GaN or SiC, semiconductor devices made of GaN material with bandgap tuning have higher channel electron mobility and carrier concentration. Therefore, GaN-based semiconductor devices can easily satisfy the demands of high power applications, such as High Electron Mobility Transistor (HEMT).

In order to produce a high quality electrode interface of a high electron mobility transistor, a high temperature annealing process is taken after the source electrode and the drain electrode are made. However, metal element in those electrodes easily diffuses to inside of the transistor during the high temperature annealing process. Thus, it raises an important issue to improve the manufacturing process of the high electron mobility transistor.

SUMMARY

A GaN-based transistor device according to an embodiment of the invention is provided, comprising: a substrate; a buffer layer, disposed on the substrate; a channel layer, disposed on the buffer layer; a barrier layer, disposed on a part of the channel layer; a passivation layer, disposed on the barrier layer, wherein the barrier layer and the passivation layer comprise a first side wall and a second side wall, and the first side wall and the second side wall are corresponding to each other; a barrier metal layer, disposed on the passivation layer, wherein the barrier metal layer has a first opening that exposes a part of the passivation layer, and the passivation layer has a second opening located in the first opening to expose a part of the barrier layer; a gate electrode, disposed on the exposed part of the barrier layer; a source electrode, disposed on the channel layer, wherein the source electrode covers the first side wall and a part of the barrier metal layer adjacent to the first side wall; and a drain electrode, disposed on the channel layer, wherein the drain electrode covers the second side wall and another part of the barrier metal layer adjacent to the second side wall; wherein the gate electrode is disposed between the source electrode and the drain electrode; wherein an interface between the source electrode and the channel layer is an Ohmic contact; wherein an interface between the drain electrode and the channel layer is another Ohmic contact; wherein an interface between the gate electrode and the barrier layer is a Schottky contact.

A manufacturing method of a GaN-based transistor device according to another embodiment of the invention is provided, comprising: providing a substrate; forming a buffer layer on the substrate; forming a channel layer on the buffer layer; forming a barrier layer on the channel layer; forming a passivation layer on the barrier layer; forming a barrier metal layer on the passivation layer; patterning the barrier layer, the passivation layer, and the barrier metal layer to expose a part of the channel layer, wherein the barrier layer and the passivation layer expose a first side wall and a second side wall, wherein the first side wall and the second side wall are corresponding to each other, wherein the first side wall, the second side wall, and the barrier metal layer forms a mesa structure; forming an electrode layer to cover the channel layer, the barrier metal layer, the first side wall, and the second side wall; patterning the electrode layer and the barrier metal layer to form a first opening, wherein the first opening exposes a part of the passivation layer and divides the electrode layer to a source electrode and a drain electrode; performing a rapid thermal process; patterning the passivation layer to form a second opening, wherein the second opening is located in the first opening and exposes a part of the barrier layer, wherein the source electrode is disposed on the part of the exposed channel layer and covers the first side wall, wherein the drain electrode is disposed on the part of the exposed channel layer and covers the second side wall; and forming a gate electrode on the exposed part of the barrier layer; wherein the gate electrode is disposed between the source electrode and the drain electrode; wherein an interface between the source electrode and the channel layer is an Ohmic contact; wherein an interface between the drain electrode and the channel layer is another Ohmic contact; wherein an interface between the gate electrode and the barrier layer is a Schottky contact.

Several exemplary embodiments accompanied with figures are described in detail below to further describe the disclosure in details.

DETAILED DESCRIPTION OF EXEMPLARY EMBODIMENTS

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

The following mentioned "stacked layer" in each embodiment of the disclosure are described in an order from down to top. For example, a stacked layer of A layer/B layer/C layer represents the B layer is disposed on the A layer, and the C layer is disposed on the B layer.

Figure 1:
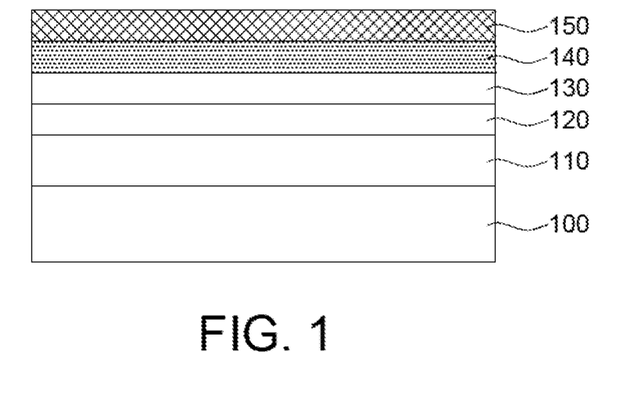
FIG. 1 to FIG. 5 are illustrating a manufacturing process of a GaN-based transistor device of an embodiment of the disclosure.

FIG. 1 to FIG. 5 are illustrating a manufacturing process of a GaN-based transistor device of an embodiment of the disclosure. As illustrated in FIG. 1, a substrate 100 is provided, and a buffer layer 110, a channel layer 120, a barrier layer 130, a passivation layer 140, and a barrier metal layer 150 are formed on the substrate 100 in sequence. The material of the substrate 100 is Si for example. For example, the method of forming the buffer layer 110, the channel layer 120, and the barrier layer 130 is metal-organic chemical vapor deposition (MOCVD), the forming method of the passivation layer 140 is plasma-enhanced chemical vapor deposition (PECVD), and the method of forming the barrier metal layer 150 is atomic layer deposition (ALD) or physical vaper deposition (PVD). For example, the material of the buffer layer is AlGaN, and the material of the channel layer 120 is GaN. The material of the barrier layer 130, for example, is AlGaN, or a stacked layer of AlGaN/GaN (that is, a GaN layer is disposed on an AlGaN layer. The material of the passivation layer 140 is, for example, low temperature nitride (LTN), low temperature oxide (LTO), or a stacked layer of LTN/LTO (that is, an LTO layer is disposed on an LTN layer). The temperature of forming LTN and LTO is lower than 250° C. for example. The material of the barrier metal layer 150 is, for example, AlN, $Al_2O_3$, a stacked layer of Ti/TiN (that is, a TiN layer is disposed on a Ti layer), a stacked layer of Ti/TiN/Ti/TiN, or a stacked layer of Ta/TaN.

Figure 2:
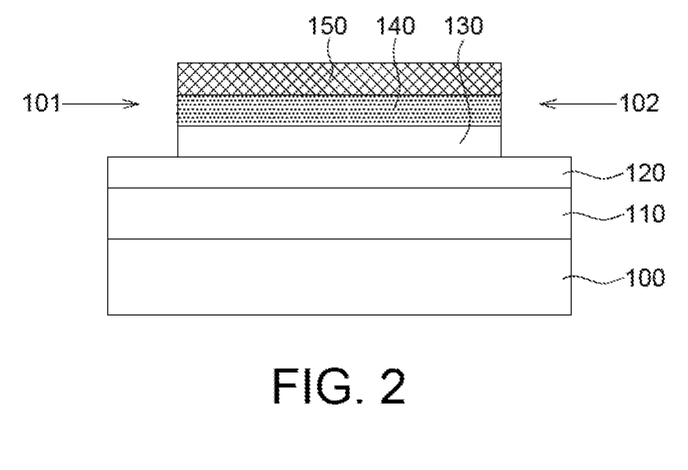

Then, patterning the barrier layer 130, the passivation layer 140, and the barrier metal layer 150 is as illustrated in FIG. 2. As shown, a part of the channel layer 120 is exposed. Also, the barrier layer 130 and the passivation layer 140 expose a first side wall 101 and a second side wall 102. The first side wall 101 and the second side wall 102 are two surfaces corresponding to each other. The first side wall 101, the second side wall 102, and the barrier metal layer 150 form a mesa structure.

Figure 3:
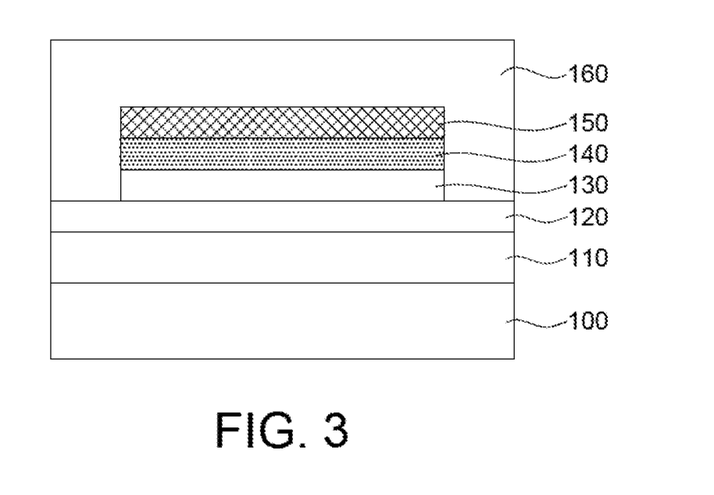

As illustrated in FIG. 3, an electrode layer 160 is formed after patterning the barrier layer 130, the passivation layer 140, and the barrier metal layer 150. The electrode 160 covers the barrier metal layer 150, the exposed part of channel layer 120, the first side wall 101, and the second side wall 102. The method of forming electrode layer 160 is physical vaper deposition for example. The material of the electrode layer 160 may be, but not limited to a stacked layer of Ti/Al/TiN.

Figure 4:
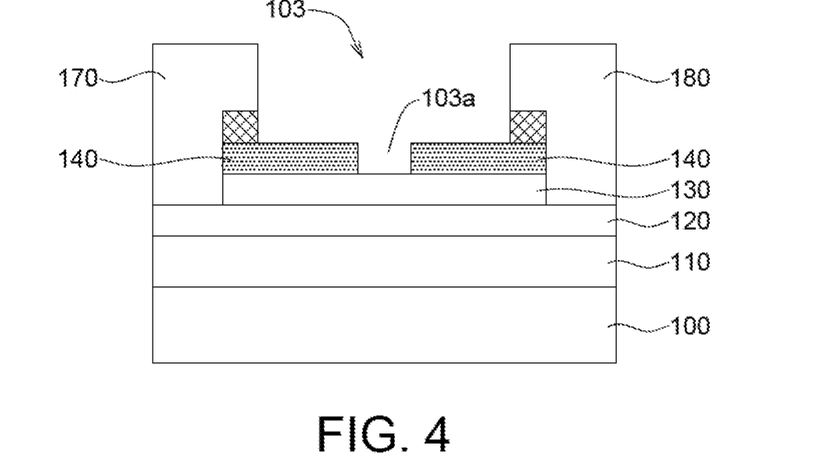

As illustrated in FIG. 4, the electrode layer 160 and the barrier metal layer 150 are patterned after the electrode layer 160 is formed. As shown, a first opening 103 is formed, the first opening 103 exposes a part of the passivation layer 140 and divides the electrode layer 160 into a source electrode 170 and a drain electrode 180. After that, a rapid thermal process (RTP) is performed to form an Ohmic contact at an interface of the source electrode 170 and the channel layer 120, and to form an Ohmic contact at an interface of the drain electrode 180 and the channel layer 120. Then, the passivation layer 140 is patterned to form a second opening 103a. The second opening 103a is located in the first opening 103, and the second opening 103a exposes a part of the barrier layer 130. The rapid thermal process increases temperature from 200° C. to 700° C.~900° C. in 20~28 seconds, then lasts the increased temperature for at least 60 seconds. For example, the rapid thermal process increases temperature from 200° C. to 700° C. in 20 seconds, then maintains the temperature of 700° C. for 60 seconds, but the scope of the disclosure is not limited thereto.

Figure 5:
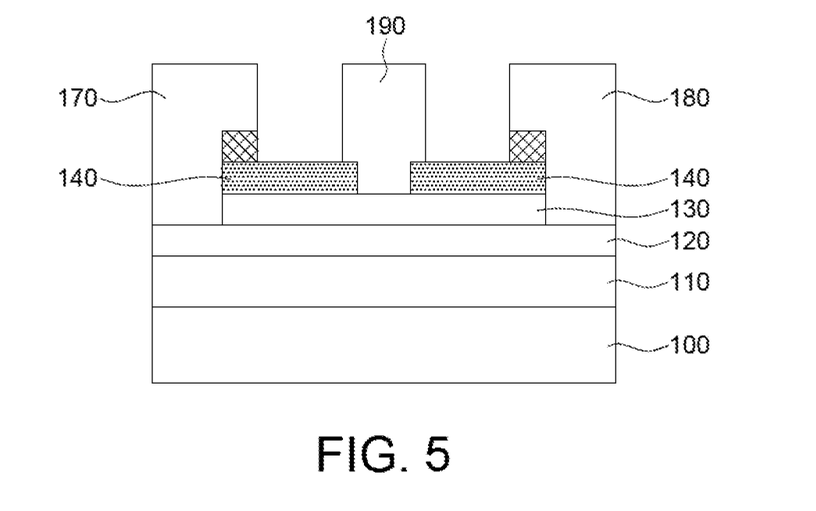

At last, a gate electrode 190 is formed on the exposed part of the barrier layer 130 as illustrated in FIG. 5, to accomplish the manufacturing process of a the GaN-based transistor device of the embodiment of the disclosure. The method of forming the gate electrode 190 is physical vaper deposition for example. The material of the gate electrode 190 is a stacked layer of TiN/Ti/Al/TiN for example. An interface of the gate electrode 190 and the barrier layer 130 may be, but not limited to a Schottky contact.

Figure 6:
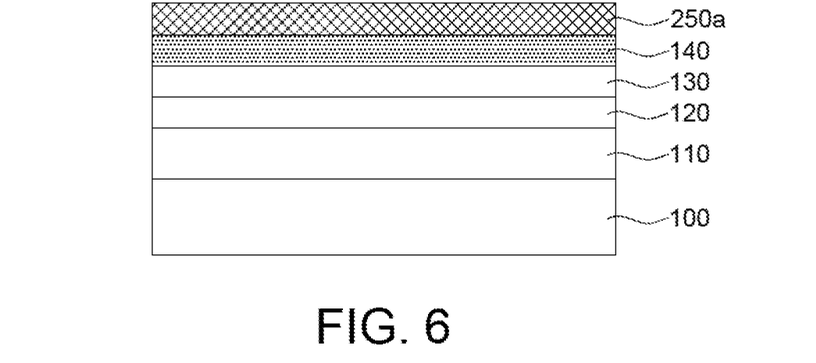
FIG. 6 to FIG. 12 are illustrating a manufacturing process of a GaN-based transistor device of another embodiment of the disclosure.

FIG. 6 to FIG. 12 are illustrating a manufacturing process of a GaN-based transistor device of another embodiment of the disclosure. As illustrated in FIG. 6, the substrate 100 is provided, and the buffer layer 110, the channel layer 120, the barrier layer 130, the passivation layer 140, and a first barrier metal layer 250a are formed on the substrate 100 in sequence. The material of the substrate 100 is Si for example. For example, the method of forming the buffer layer 110, the channel layer 120 and the barrier layer 130 is metal-organic chemical vapor deposition (MOCVD), and the method of forming the passivation layer 140 is plasma-enhanced chemical vapor deposition (PECVD. For example, the material of the buffer layer is AlGaN, and the material of the channel layer 120 is GaN. The material of the barrier layer 130, for example, is AlGaN or a stacked layer of AlGaN and GaN. The material of the passivation layer 140 is, for example, low temperature nitride (LTN), low temperature oxide (LTO), or a stacked layer of LTN/LTO. The temperature of forming LTN and LTO is lower than 250° C. for example.

Figure 7:
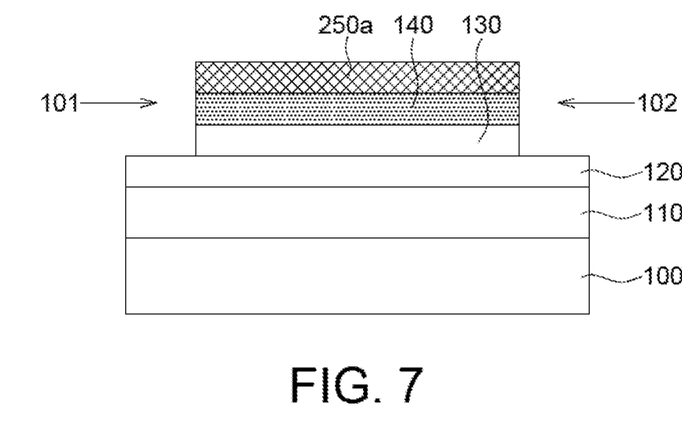

Then, the barrier layer 130, the passivation layer 140, and the first barrier metal layer 250a are patterned as illustrated in FIG. 7. As shown, a part of the channel layer 120 is exposed. Also, the barrier layer 130 and the passivation layer 140 expose the first side wall 101 and the second side wall 102. The first side wall 101 and the second side wall 102 are two surfaces corresponding to each other. The first side wall 101, the second side wall 102, and the passivation layer 140 form a mesa structure. The method of forming the first barrier metal layer 250a is atomic layer deposition (ALD) or physical vaper deposition. The material of the first barrier metal layer 250a is, for example, AlN, $Al_2O_3$, a stacked layer of Ti/TiN, a stacked layer of Ti/TiN/Ti/TiN, or a stacked layer of Ta/TaN.

Figure 8:
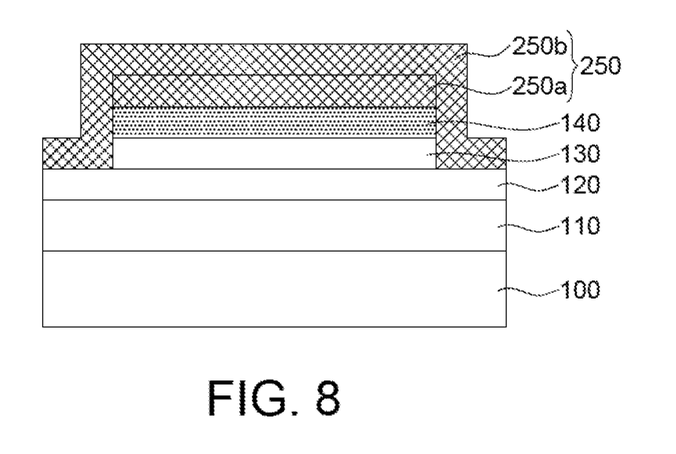

As illustrated in FIG. 8, a second barrier metal layer 250b is formed after patterning the barrier layer 130 and the passivation layer 140. The second barrier metal layer 250b covers the first barrier metal layer 250a, the exposed part of channel layer 120, the first side wall 101, and the second side wall 102. The method of forming the second barrier metal layer 250b is atomic layer deposition (ALD) or physical vaper deposition for example. The material of the second barrier metal layer 250b is same as the material of the first barrier metal layer 250a.

Figure 9:
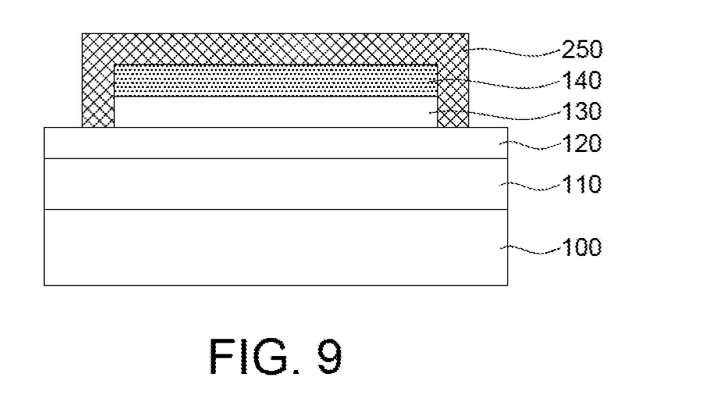

As illustrated in FIG. 9, the second barrier metal layer 250b is etched to remove a part of the second barrier metal layer 250b covered the channel layer 120 and another part of the second barrier metal layer 250b covered the first barrier metal layer 250a. As a result, the patterned second barrier metal layer 250b and the first barrier metal layer 250a form a metal barrier layer 250. The metal barrier layer 250 covers the passivation layer 140, the first side wall 101, and the second side wall 102.

Figure 10:
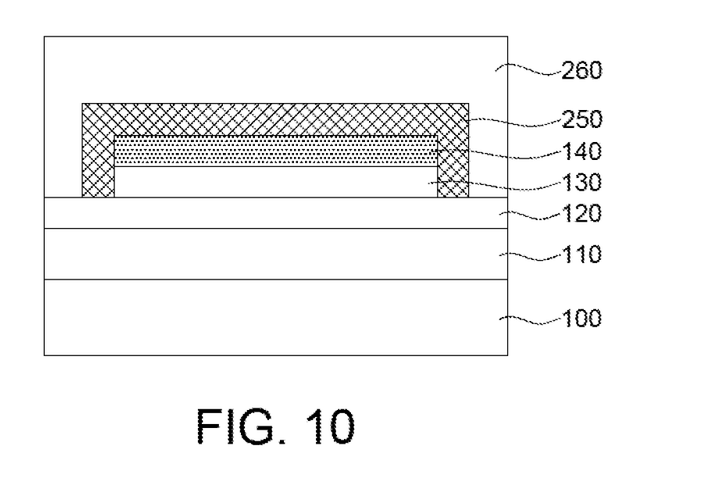

Then, an electrode layer 260 is formed to cover the metal barrier layer 250 and the exposed channel layer 120, as illustrated in FIG. 10. The method of forming the electrode layer 260 is physical vaper deposition, for example. The material of the electrode layer 260 is a stacked layer of Ti/Al/TiN, for example.

Figure 11:
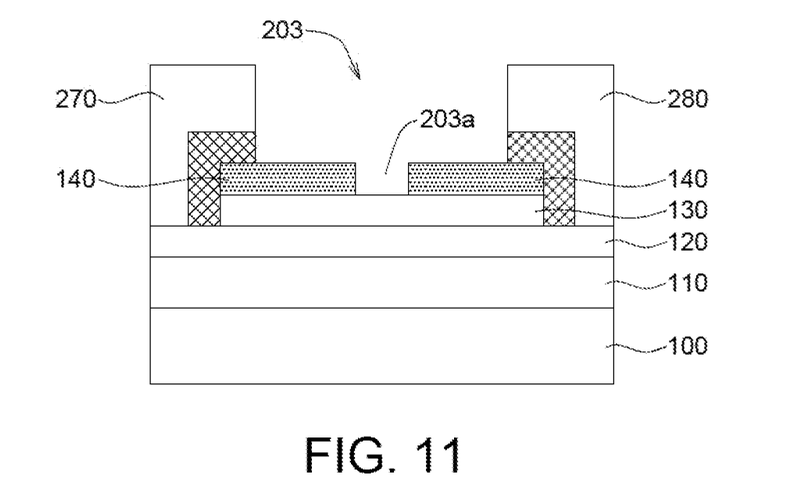

As illustrated in FIG. 11, the electrode layer 260 and the barrier metal layer 250 are patterned after the electrode layer 260 is formed. As a result, a first opening 203 is formed, wherein the first opening 203 exposes a part of the passivation layer 140 and divides the electrode layer 260 into a source electrode 270 and a drain electrode 280. After that, a rapid thermal process (RTP) is performed to form an Ohmic contact at an interface of the source electrode 270 and the channel layer 120, and to form an Ohmic contact at an interface of the drain electrode 280 and the channel layer 120. Then, the passivation layer 140 is patterned to form a second opening 203a. The second opening 203a is located in the first opening 203, and the second opening 203a exposes a part of the barrier layer 130. The rapid thermal process increases temperature from 200° C. to 700° C.~900° C. in 20~28 seconds, then lasts the increased temperature for at least 60 seconds. For example, the rapid thermal process increases temperature from 200° C. to 700° C. in 20 seconds, then maintains the temperature of 700° C. for 60 seconds, but the scope of the disclosure is not limited thereto.

Figure 12:
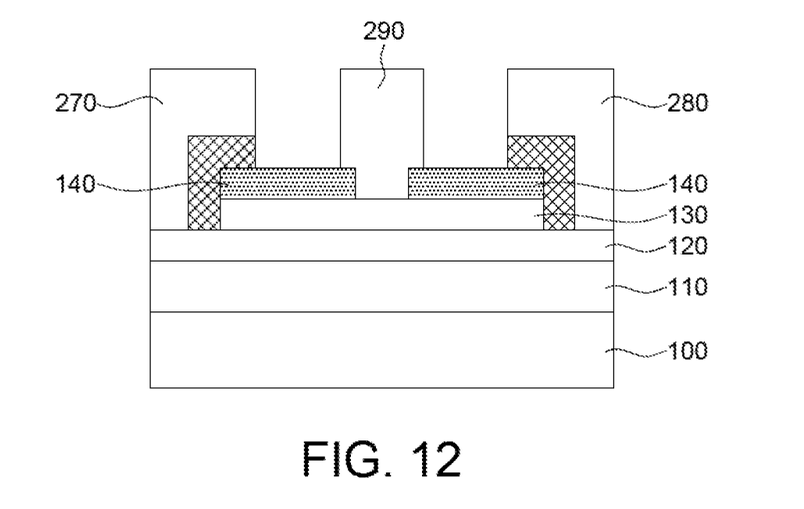

At last, a gate electrode 290 is formed on the exposed part of the barrier layer 140, as illustrated in FIG. 12, to accomplish the manufacturing process of a GaN-based transistor device of another embodiment of the disclosure. The method of forming the gate electrode 290 is physical vaper deposition, for example. The material of the gate electrode 290 is a stacked layer of TiN/Ti/Al/TiN, for example. An interface of the gate electrode 290 and the barrier layer 130 is a Schottky contact.

A GaN-based transistor device of an embodiment of the disclosure, as illustrated in FIG. 5, comprises the substrate 100, the buffer layer 110, the channel layer 120, the barrier layer 130, the passivation layer 140, the barrier metal layer 150, the source electrode 170, the drain electrode 180, and the gate electrode 190. The buffer layer 110 is disposed on the substrate 100, the channel layer 120 is disposed on the buffer layer 110, the barrier layer 130 is disposed on a part of the channel layer 120, the passivation layer 140 is disposed on the barrier layer 130, and the barrier metal layer 150 is disposed on the passivation layer 140. The barrier layer 130 and the passivation layer 140 comprise a first side wall 101 and a second side wall 102. The first side wall 101 and the second side wall 102 are two surfaces corresponding to each other. The barrier metal layer 150 comprises a first opening 103, and the first opening 103 exposes a part of the passivation layer 140. The passivation layer 140 comprises a second opening 103a located in the first opening 103, and the second opening 103a exposes a part of the barrier layer 130. The source electrode 170 is disposed on the channel layer 120, and the source electrode 170 covers the first side wall 101 and a part of the barrier metal layer 150 adjacent to the first side wall 101. The drain electrode 180 is disposed on the channel layer 120, and the drain electrode 180 covers the second side wall 102 and another part of the barrier metal layer 150 adjacent to the second side wall 102. The gate electrode 190 is disposed between the source electrode 170 and the drain electrode 180, and the gate electrode 190 is disposed on the exposed part of the barrier layer 130.

For example, the material of the substrate 100 is Si, the material of the buffer layer 110 is AlGaN, the material of the channel layer 120 is GaN, and the material of the barrier layer 130 is AlGaN or a stacked layer of AlGaN and GaN. The material of the passivation layer 140 is LTN, LTO, or a stacked layer of LTN/LTO for example. The temperature of forming the LTN and the LTO is under 250° C. for example. The material of the barrier metal layer 150 is AlN, Al$_2$O$_3$, a stacked layer of Ti/TiN, a stacked layer of Ti/TiN/Ti/TiN, or a stacked layer of Ta/TaN. An interface of the source electrode 170 and the channel layer 120 is an Ohmic contact. An interface of the drain electrode 180 and the channel layer 120 is an Ohmic contact. An interface of the gate electrode 190 and the barrier layer 130 is a Schottky contact. The material of the source electrode 170 and the drain electrode 180 is a stacked layer of Ti/Al/TiN, for example. The material of the gate electrode 190 is a stacked layer of TiN/Ti/Al/TiN, for example.

A GaN-based transistor device of another embodiment of the disclosure, as illustrated in FIG. 12, comprises the substrate 100, the buffer layer 110, the channel layer 120, the barrier layer 130, the passivation layer 140, the barrier metal layer 250, the source electrode 270, the drain electrode 280, and the gate electrode 290. The buffer layer 110 is disposed on the substrate 100, the channel layer 120 is disposed on the buffer layer 110, the barrier layer 130 is disposed on a part of the channel layer 120, the passivation layer 140 is disposed on the barrier layer 130, and the barrier metal layer 250 is disposed on the passivation layer 140. The barrier layer 130 and the passivation layer 140 comprise a first side wall 101 and a second side wall 102. The first side wall 101 and the second side wall 102 are two surfaces corresponding to each other. The barrier metal layer 250 comprises a first opening 203, the first opening 203 exposes a part of the passivation layer 140. The passivation layer 140 comprises a second opening 203a located in the first opening 203, wherein the second opening 203a exposes a part of the barrier layer 130. The source electrode 270 is disposed on the channel layer 120, and the source electrode 270 covers a part of the barrier metal layer 250 adjacent to the first side wall 101. The drain electrode 280 is disposed on the channel layer 120, and the drain electrode 280 covers another part of the barrier metal layer 250 adjacent to the second side wall 102. The gate electrode 290 is disposed between the source electrode 270 and the drain electrode 280, and the gate electrode 290 is disposed on the exposed part of barrier layer 130.

For example, the material of the substrate 100 is Si, the material of the buffer layer 110 is AlGaN, the material of the channel layer 120 is GaN, and the material of the barrier layer 130 is AlGaN or a stacked layer of AlGaN and GaN. The material of the passivation layer 140 is LTN, LTO, or a stacked layer of LTN/LTO, for example. The temperature of forming the LTN and the LTO is under 250° C., for example. The material of the barrier metal layer 250 is AlN, Al$_2$O$_3$, a stacked layer of Ti/TiN, a stacked layer of Ti/TiN/Ti/TiN, or a stacked layer of Ta/TaN. An interface of the source electrode 270 and the channel layer 120 is an Ohmic contact. An interface of the drain electrode 280 and the channel layer 120 is an Ohmic contact. An interface of the gate electrode 290 and the barrier layer 130 is a Schottky contact. The material of the source electrode 270 and the drain electrode 280 is a stacked layer of Ti/Al/TiN, for example. The material of the gate electrode 290 is a stacked layer of TiN/Ti/Al/TiN, for example.

The difference between the GaN-based transistor device of the embodiment illustrated in FIG. 12 and the GaN-based transistor device of an embodiment illustrated in FIG. 5 is that the barrier metal layer 250 in FIG. 12 covers not only the peripheral area of the passivation layer 140 but also side walls of the barrier layer 130 and the passivation layer 140. In the other words, the barrier metal layer 250 is extended to cover the first side wall 101 and the second side wall 102 in the embodiment of FIG. 12. So that, the barrier metal layer 250 is disposed between the source electrode 270 and the first side wall 101, also, the barrier metal layer 250 is disposed between the drain electrode 280 and the second side wall 102.

Figure 13A:
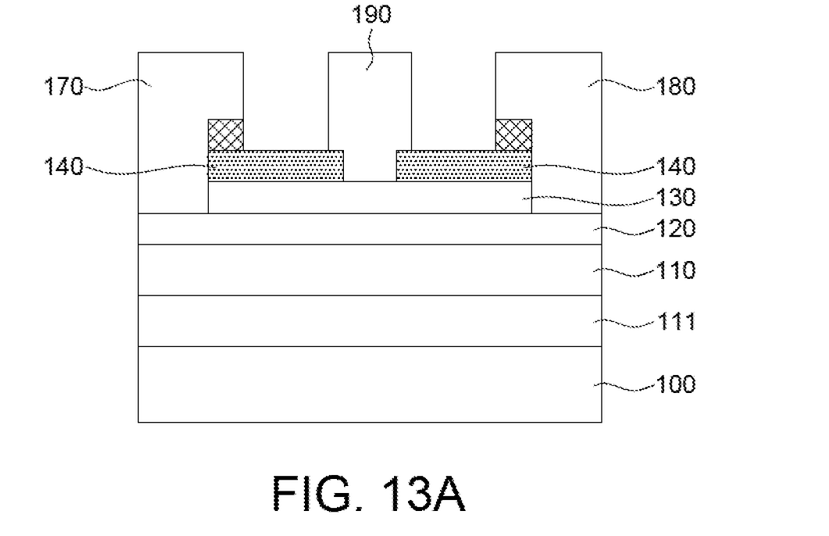
FIG. 13A is a cross section view of a GaN-based transistor device of still another embodiment of the disclosure.

FIG. 13A is a cross section view of a GaN-based transistor device of still another embodiment of the disclosure. The difference between the GaN-based transistor device of the embodiment illustrated in FIG. 13A and the GaN-based transistor device of the embodiment illustrated in FIG. 5 is that a nucleation layer 111 illustrated in FIG. 13A is formed on the substrate 100 before forming the buffer layer 110. The nucleation layer 111 is disposed between the substrate 100 and the buffer layer 110. Other components in the embodiment illustrated in FIG. 13A are same as the components with identical labels in the embodiment illustrated in FIG. 5, so no description is repeated here.

Figure 13B:
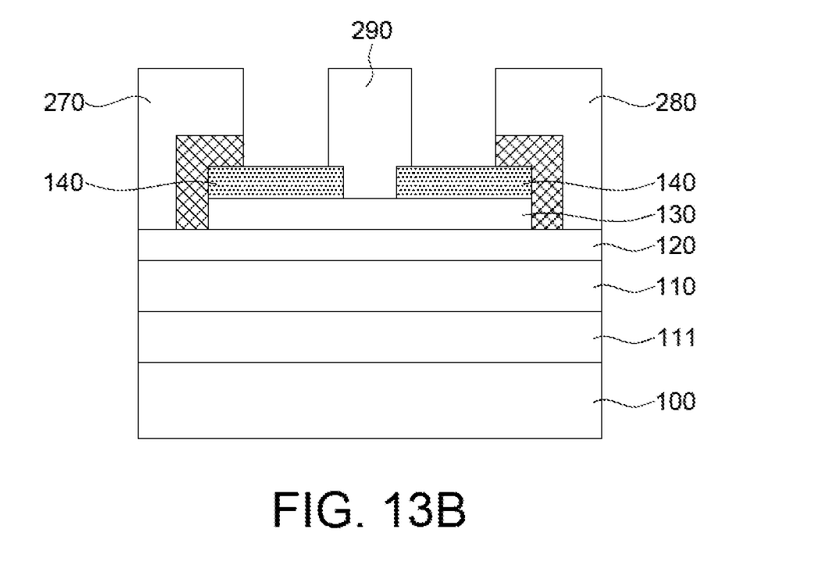
FIG. 13B is a cross section view of a GaN-based transistor device of yet another embodiment of the disclosure.

FIG. 13B is a cross section view of a GaN-based transistor device of yet another embodiment of the disclosure. The difference between the GaN-based transistor device of the embodiment illustrated in FIG. 13B and the GaN-based transistor device of the embodiment illustrated in FIG. 12 is that, a nucleation layer 111 is formed on the substrate 100 before forming the buffer layer 110. The nucleation layer 111 is disposed between the substrate 100 and the buffer layer 110. Other components in the embodiment are same as the components with identical labels in another embodiment of the invention, so it is not described repeatedly.

In summary, the GaN-based transistor devices according to the embodiments of the disclosure reduces the diffusion effect of metal elements in the electrodes of the GaN-based transistor device in a high temperature annealing process by disposing a structure of the barrier metal layer in the GaN-based transistor device. As a result, the metal elements in the electrodes of the transistor device diffusing to inside of the GaN-based transistor device can be avoided, therefore the characteristics of the GaN-based transistor device are improved.

It will be apparent to those skilled in the art that various modifications and variations can be made to the structure of the disclosed embodiments without departing from the scope or spirit of the disclosure. It is intended that the specification and examples be considered as exemplars only, with a true scope of the disclosure being indicated by the following claims and their equivalents.

What is claimed is:

1. A GaN-based transistor device, comprising:
   a substrate;
   a buffer layer, disposed on the substrate;
   a channel layer, disposed on the buffer layer;
   a barrier layer, disposed on a part of the channel layer;
   a passivation layer, disposed on the barrier layer, wherein the barrier layer and the passivation layer comprise a first side wall and a second side wall, and the first side wall and the second side wall are corresponding to each other;
   a barrier metal layer, disposed on the passivation layer, wherein the barrier metal layer has a first opening that exposes a part of the passivation layer, and the passivation layer has a second opening located in the first opening to expose a part of the barrier layer;
   a gate electrode, disposed on the exposed part of the barrier layer;
   a source electrode, disposed on the channel layer, wherein the source electrode covers the first side wall and a part of the barrier metal layer adjacent to the first side wall; and
   a drain electrode, disposed on the channel layer, wherein the drain electrode covers the second side wall and another part of the barrier metal layer adjacent to the second side wall;
   wherein the gate electrode is disposed between the source electrode and the drain electrode; wherein an interface between the source electrode and the channel layer is an Ohmic contact; wherein an interface between the drain electrode and the channel layer is another Ohmic contact; wherein an interface between the gate electrode and the barrier layer is a Schottky contact.

2. The GaN-based transistor device as claimed in claim 1, wherein the barrier metal layer further extends to cover the first side wall and the second side wall, the barrier metal layer is disposed between the source electrode and the first side wall, and the barrier metal layer is disposed between the drain electrode and the second side wall.

3. The GaN-based transistor device as claimed in claim 1, further comprising a nucleation layer disposed between the substrate and the buffer layer.

4. The GaN-based transistor device as claimed in claim 3, wherein a material of the nucleation layer is AlN.

5. The GaN-based transistor device as claimed in claim 1, wherein a material of the substrate is Si.

6. The GaN-based transistor device as claimed in claim 1, wherein a material of the buffer layer is AlGaN.

7. The GaN-based transistor device as claimed in claim 1, wherein a material of the channel layer is GaN.

8. The GaN-based transistor device as claimed in claim 1, wherein the barrier layer comprises an AlGaN layer and a GaN layer, and the GaN layer is disposed on the AlGaN layer.

9. The GaN-based transistor device as claimed in claim 1, wherein the passivation layer comprises a low temperature nitride layer and a low temperature oxide layer, and the low temperature oxide layer is disposed on the low temperature nitride layer.

10. The GaN-based transistor device as claimed in claim 1, wherein a material of the barrier metal layer comprises AlN, $Al_2O_3$, a stacked layer of Ti/TiN, a stacked layer of Ti/TiN/Ti/TiN, or a stacked layer of Ta/TaN; wherein Ti/TiN represents that a TiN layer is disposed on a Ti layer; and Ta/TaN represents that a TaN layer is disposed on a Ta layer.

11. A manufacturing method of a GaN-based transistor device, comprising:
   providing a substrate;
   forming a buffer layer on the substrate;
   forming a channel layer on the buffer layer;
   forming a barrier layer on the channel layer;
   forming a passivation layer on the barrier layer;
   forming a barrier metal layer on the passivation layer;
   patterning the barrier layer, the passivation layer, and the barrier metal layer to expose a part of the channel layer, wherein the barrier layer and the passivation layer expose a first side wall and a second side wall, wherein the first side wall and the second side wall are corresponding to each other, wherein the first side wall, the second side wall, and the barrier metal layer forms a mesa structure;
   forming an electrode layer to cover the channel layer, the barrier metal layer, the first side wall, and the second side wall;
   patterning the electrode layer and the barrier metal layer to form a first opening, wherein the first opening exposes a part of the passivation layer and divides the electrode layer into a source electrode and a drain electrode;

performing a rapid thermal process;

patterning the passivation layer to form a second opening, wherein the second opening is located in the first opening and exposes a part of the barrier layer, wherein the source electrode is disposed on the part of the exposed channel layer and covers the first side wall, wherein the drain electrode is disposed on the part of the exposed channel layer and covers the second side wall; and forming a gate electrode on the exposed part of the barrier layer;

wherein the gate electrode is disposed between the source electrode and the drain electrode; wherein an interface between the source electrode and the channel layer is an Ohmic contact; wherein an interface between the drain electrode and the channel layer is another Ohmic contact; wherein an interface between the gate electrode and the barrier layer is a Schottky contact.

12. The manufacturing method of the GaN-based transistor device of claim 11, wherein after the barrier layer, the passivation layer, and the barrier metal layer are patterned to expose the channel layer, and the barrier metal layer is formed to extend to cover the first side wall and the second side wall; wherein the barrier metal layer is disposed between the source electrode and the first side wall; wherein the barrier metal layer is disposed between the drain electrode and the second side wall.

13. The manufacturing method of the GaN-based transistor device of claim 11, wherein before forming the buffer layer, a nucleation layer is formed on the substrate, and the nucleation layer is disposed between the substrate and the buffer layer.

14. The manufacturing method of the GaN-based transistor device of claim 13, wherein a material of the nucleation layer is AlN.

15. The manufacturing method of the GaN-based transistor device of claim 11, wherein a material of the substrate is Si.

16. The manufacturing method of the GaN-based transistor device of claim 11, wherein a material of the buffer layer is AlGaN.

17. The manufacturing method of the GaN-based transistor device of claim 11, wherein a material of the channel layer is GaN.

18. The manufacturing method of the GaN-based transistor device of claim 11, wherein forming the barrier layer comprises: forming an AlGaN layer, and forming a GaN layer on the AlGaN layer.

19. The manufacturing method of the GaN-based transistor device of claim 11, wherein forming the passivation layer comprises: forming a low temperature nitride layer, and forming a low temperature oxide layer on the low temperature nitride layer, wherein a temperature of forming the low temperature nitride layer and the low temperature oxide layer is lower than 250° C.

20. The manufacturing method of the GaN-based transistor device of claim 11, wherein forming the barrier metal layer comprises: forming an AlN layer, forming an $Al_2O_3$ layer, forming a stacked layer of Ti/TiN, forming a stacked layer of Ti/TiN/Ti/TiN, or forming a stacked layer of Ta/TaN; wherein Ti/TiN represents that a TiN layer is disposed on a Ti layer; and Ta/TaN represents that a TaN layer is disposed on a Ta layer.

* * * * *